United States Patent
Tian et al.

(10) Patent No.: US 6,844,612 B1
(45) Date of Patent: Jan. 18, 2005

(54) LOW DIELECTRIC CONSTANT FLUORINE-DOPED SILICA GLASS FILM FOR USE IN INTEGRATED CIRCUIT CHIPS AND METHOD OF FORMING THE SAME

(75) Inventors: Jason Tian, Milpitas, CA (US); Wenxian Zhu, Palo Alto, CA (US); M. Ziaul Karim, San Jose, CA (US); Cong Do, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/426,643

(22) Filed: Apr. 29, 2003

Related U.S. Application Data

(63) Continuation of application No. 10/096,740, filed on Mar. 12, 2002, now abandoned.

(51) Int. Cl.[7] .............................................. H01L 23/58
(52) U.S. Cl. ...................... 257/634; 257/635; 257/650
(58) Field of Search ................................ 257/634, 635, 257/650, 655

(56) References Cited

U.S. PATENT DOCUMENTS

| | | | | |
|---|---|---|---|---|
| 5,763,010 A | * | 6/1998 | Guo et al. | 427/376.2 |
| 6,440,852 B1 | * | 8/2002 | Meder et al. | 438/687 |
| 6,506,690 B1 | * | 1/2003 | Lobbins | 438/783 |

* cited by examiner

Primary Examiner—William M. Brewster
(74) Attorney, Agent, or Firm—Beyer Weaver & Thomas, LLP

(57) ABSTRACT

A fluorine-doped silica glass (FSG) dielectric layer includes a number of sublayers. Each sublayer is doped with fluorine in such a way that the doping concentration of fluorine in the sublayer decreases as one moves from an interior region of the sublayer towards one or both of the interfaces between the sublayer and adjacent sublayers. This structure reduces the generation of HF when the layer is exposed to moisture and thereby improves the stability and adhesion properties of the layer. The principles of this invention can also be applied to dielectric layers doped with such other dopants as boron, phosphorus or carbon.

8 Claims, 6 Drawing Sheets

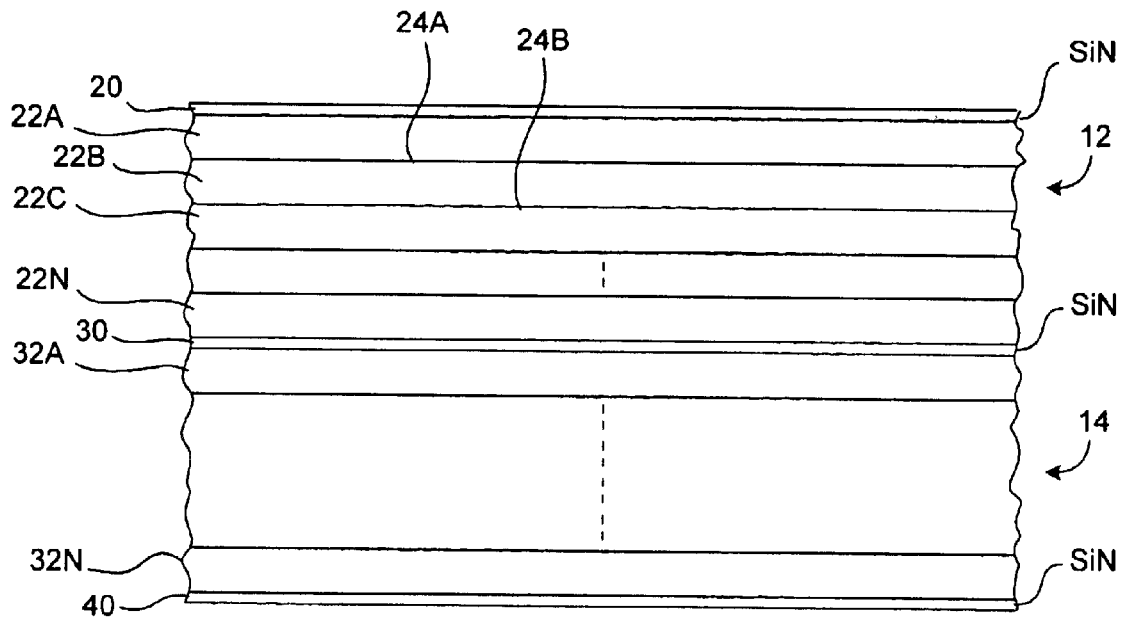
FIG. 1
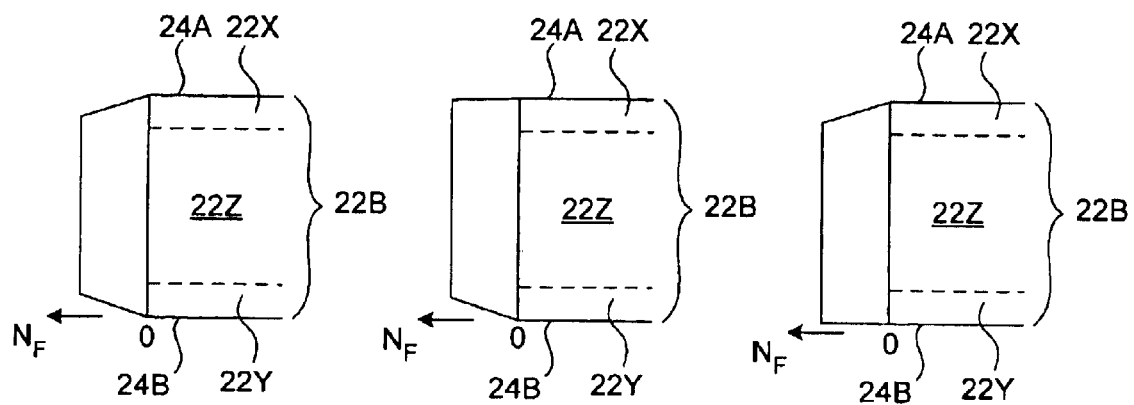
FIG. 2A  FIG. 2B  FIG. 2C

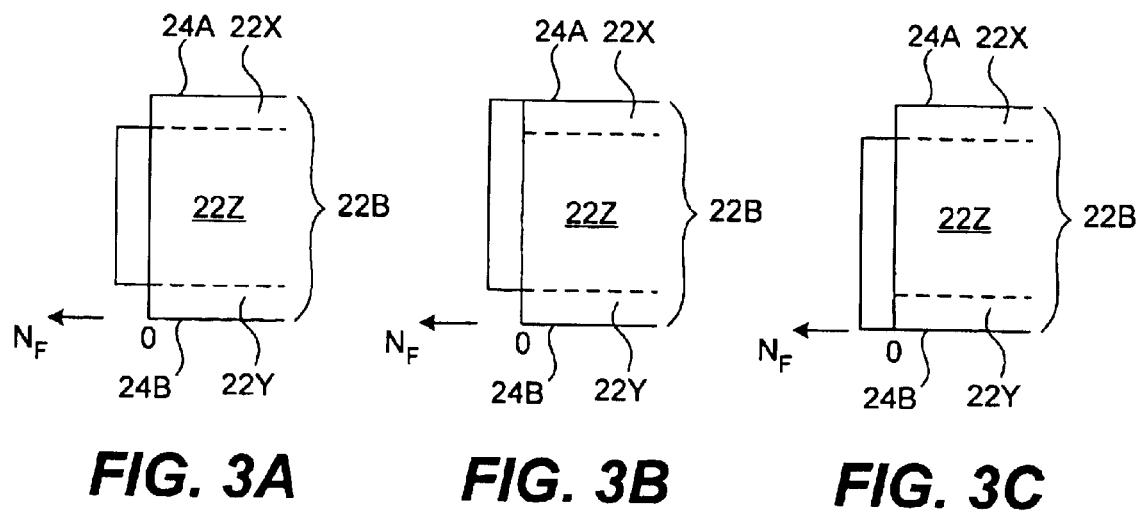
FIG. 3A    FIG. 3B    FIG. 3C

US 6,844,612 B1

LOW DIELECTRIC CONSTANT FLUORINE-DOPED SILICA GLASS FILM FOR USE IN INTEGRATED CIRCUIT CHIPS AND METHOD OF FORMING THE SAME

This application is a continuation of application Ser. No. 10/096,740, filed Mar. 12, 2002, now abandoned.

FIELD OF THE INVENTION

This invention relates to the field of semiconductor integrated circuit (IC) chips and in particular to low dielectric constant interlayer dielectric films in IC chips.

BACKGROUND OF THE INVENTION

IC chips typically include active or passive electrical components (e.g., transistors, diodes) connected together by metal lines formed in successive layers above the surface of the semiconductor material. The metal lines are separated by layers of an insulating material commonly referred to as interlayer dielectric.

As is well known, the size of IC chips has shrunk dramatically, enabling a higher packing density of electrical components to be placed in a given area of the chip and increasing the speed at which the circuitry included in the chip can operate. These increases in operating speed are partially offset, however, by the increased resistance-capacitance (RC) delays that result from the closer spacing between adjacent metal lines.

Since capacitance is directly proportional to the dielectric constant (k), the RC delays in ICs, can be reduced through the use of a low-dielectric-constant material as the insulating material. The need for lower dielectric constant materials for use as interlayer dielectrics for modem semiconductor technology is well known in the semiconductor industry. For example, silicon dioxide ($SiO_2$), has long been used as a dielectric for integrated circuits because of its excellent thermal stability and relatively good dielectric properties (k~4.2). However, the need exists for a dielectric material which is suitable for use in ICs which has a lower dielectric constant than $SiO_2$. After extensive study, a very promising dielectric material has been identified, known as fluorosilicate glass (FSG), which has a dielectric constant (k) of less than 3.7.

The dielectric constant of an FSG layer can be reduced by increasing the doping concentration of fluorine within the FSG layer. A problem with this, however, is that with increased fluorine concentrations hydrofluoric acid (HF) is more likely to form if the FSG layer is exposed to moisture. The generation of HF decreases the stability and adhesion properties of the FSG film. In addition, fluorine can attack Al and Cu wiring to cause resistance changes and reliability problems.

One solution to this problem has been to form a relatively thick silicon rich oxide (SRO) cap on the FSG layer in an attempt to shield the layer from moisture and other foreign materials. Since SRO has a high k, this increases the overall dielectric constant of the structure significantly. In addition, in the damascene process that is used with Cu layers the SRO cap is typically removed by chemical-mechanical planarization (CMP), thereby exposing the fluorine rich FSG layer to moisture and causing the formation of HF.

Accordingly, there is a real need for an FSG layer that has a low dielectric constant and yet is stable enough to be used with a damascene process.

SUMMARY OF THE INVENTION

In accordance with this invention, the flow of a fluorine or other dopant-containing gas into a reaction chamber is varied such that the doping concentration of fluorine or other dopant in an upper and/or lower region of an FSG sublayer is lower than a doping concentration thereof in an interior region of the sublayer.

In one variation of the method a substrate is positioned in a reaction chamber. A first process gas is introduced into said chamber, a flow of a second, silicon-containing process gas into the chamber is begun, the first and second process gases interacting to form an FSG dielectric layer on said substrate; a flow of a third, dopant-containing gas into said chamber is begun, said third gas containing at least one gas from the group consisting of fluorine, boron, phosphorus and carbon; the flow of the third, dopant-containing gas is terminated; and the flow of the second, silicon-containing process gas is terminated. There is a predetermined time interval between (A) the time at which the flow of the second process gas is begun and the time at which the flow of the third process gas is begun, and/or (B) the time at which the flow of the third process gas is terminated and the time at which the flow of the silicon-containing gas is terminated.

In another variation of the process, while the flow of the second, silicon-containing process gas into said chamber is taking place, the flow rate of the third, dopant-containing gas into said chamber is gradually increased. After the flow rate of the third, dopant-containing gas has reached a maximum level, the flow rate of the third, dopant-containing gas is gradually decreased.

The FSG dielectric layer of this invention includes a plurality of FSG sublayers, each of the sublayers abutting at least one adjacent sublayer at an interface, a doping concentration of fluorine in an interior region of each sublayer being greater than a doping concentration of fluorine at an interface between the sublayer and at least one adjacent sublayer. In some embodiments, each of the sublayers has a first doping concentration of fluorine at an interior region of the sublayer, the first doping concentration being greater than a second doping concentration of fluorine in an upper region of the sublayer and said first doping concentration being greater than a third doping concentration of fluorine in a lower region of the sublayer.

BRIEF DESCRIPTION OF THE DRAWINGS

FIG. 1 is a cross-sectional view of an FSG film in accordance with the invention.

FIGS. 2A–2C show exemplary F doping concentration profiles in FSG films according to the invention.

FIGS. 3A–3C show more exemplary F doping concentration profiles in FSG films according to the invention.

DESCRIPTION OF THE INVENTION

Figure 4:
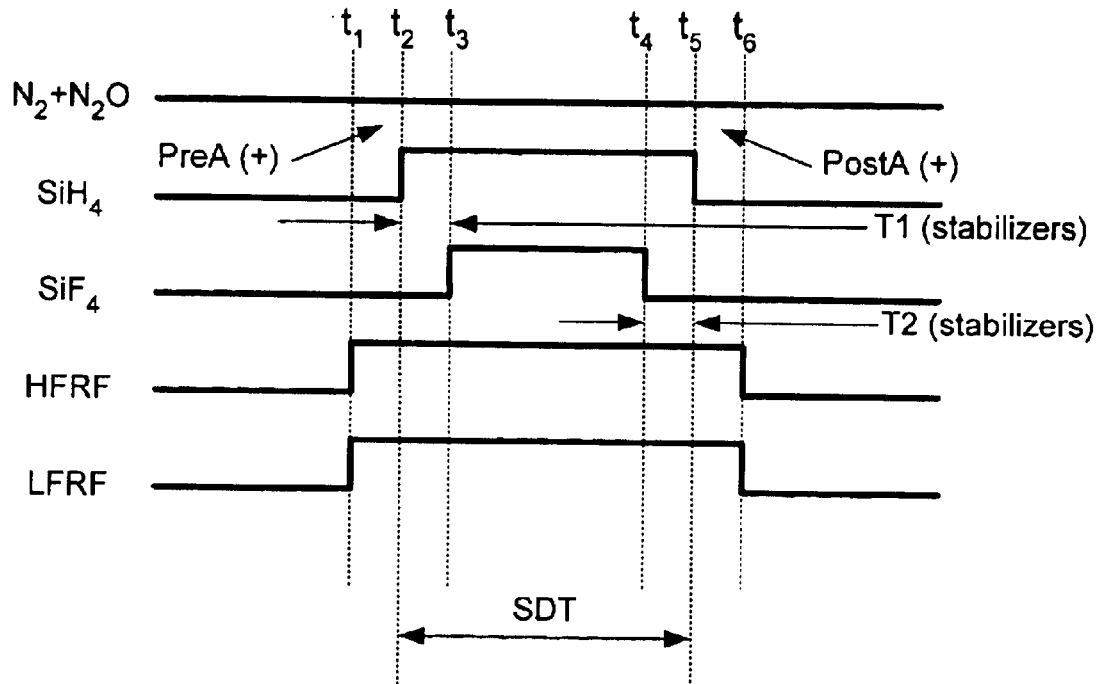
FIG. 4 is a time diagram illustrating a process for forming an FSG film in accordance with the invention.

Most embodiments of this invention include a plurality of FSG sublayers stacked one upon another. FIG. 1 illustrates a dielectric structure 10 that includes two FSG layers 12 and 14. Each of FSG layers 12 and 14 includes a plurality of FSG sublayers. FSG layer 12 includes FSG sublayers 22A, 22B ... 22N; FSG layer 14 includes FSG sublayers 32A ... 32N. The sublayers are joined at interfaces. For example, sublayers 22A and 22B are joined at interface 24A, and sublayers 22B and 22C are joined at interface 24B.

In the embodiment shown in FIG. 1, FSG layers 12 and 14 are bounded by SiN layers 20, 30 and 40 although this feature is not essential to the invention.

To decrease the dielectric constant k of FSG layers 12 and 14, each of sublayers 22A–22N and 32A–32N is doped with fluorine. Possible doping concentration profiles of FSG sublayers 22A–22N and 32A–32N are illustrated in FIGS. 2A–2C and FIGS. 3A–3C, using sublayer 22B as an example. On the left side of each of FIGS. 2A–2C and FIGS. 3A–3C is a curve illustrating the doping concentration of fluorine ($N_F$) in three regions of layer 22B: an interior region 22Z, an upper region 22X (which abuts interface 24A), and a lower region 22Y (which abuts interface 24B).

Referring initially to FIG. 2A, $N_F$ increases in upper region 22X from zero at interface 24A; likewise, $N_F$ increases in lower region 22Y from zero at interface 24B. $N_F$ is relatively constant in interior region 22Z. In FIG. 2B, $N_F$ increases in lower region 22Y from zero at interface 24B and is relatively constant in interior region 22Z and upper region 22X. In FIG. 2C, $N_F$ increases in upper region 22X from zero at interface 24A and is relatively constant in interior region 22Z and lower region 22Y.

In FIGS. 3A–3C. $N_F$ is increased and reduced as a step function, leaving regions that have no concentration of fluorine. In FIG. 3A, there is no fluorine in either of the upper and lower regions 22X and 22Y. In FIG. 3B, $N_F$ increases as a step function at the top of lower region 22Y and is relatively constant in interior region 22Z and upper region 22X. In FIG. 3C, $N_F$ is relatively constant in lower region 22X and interior region 22Z but falls to zero in upper region 22X.

The fluorine doping profiles shown in FIGS. 2A–2C and FIGS. 3A–3C can be combined. For example, the gradual increase in lower region 22Y shown in FIGS. 2A and 2B may be combined with the sharp decrease in upper region 22X shown in FIGS. 3A and 3C. The step increase in lower region 22Y shown in FIGS. 3A and 3B may be combined with the gradual decrease in upper region 22X shown in FIGS. 2A and 2C.

Although the thicknesses of the sublayers may vary, typically the thickness of the undoped or lightly doped regions 22X, 22Y is in the range of 5–30% of the thickness of the entire sublayer 22B.

The fluorine doping profiles shown in FIGS. 2A–2C and FIGS. 3A–3C may be obtained by varying the flow of a fluorine-containing gas during the deposition of FSG layers 12 and 14. Advantageously, a chemical vapor deposition (CVD) process is used but other processes may also be used. Plasma-enhanced chemical vapor deposition (PECVD) and high density plasma chemical vapor deposition (HP-CVD) are two possibilities.

A multi-station PECVD reactor such as the SEQUEL EXPRESS or VECTOR reactor available from Novellus Systems, Inc. of San Jose, Calif., is in many respects ideal for producing the FSG layers of this invention. This reactor has multiple stations and semiconductor wafers or other substrates are moved through the stations in succession. A single sublayer may be formed at each station.

Figure 5:
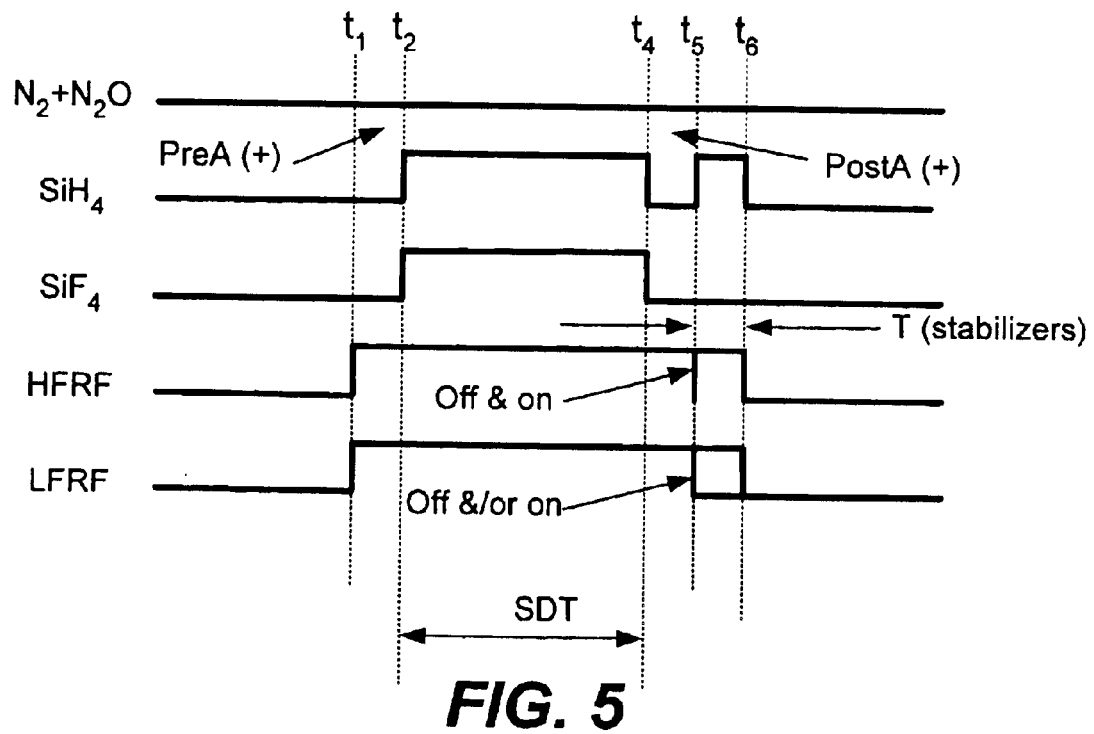
FIG. 5 is a time diagram illustrating another process for forming an FSG film in accordance with the invention.

FIGS. 4 and 5 illustrate conceptually the adjustment of several parameters in two processes in accordance with this invention. The processes are performed using a Novellus SEQUEL EXPRESS reactor. Each figure depicts the process at a single deposition station of the reactor. Generally speaking, the power density on the substrate is in the range 0.5 to 3.0 watts/cm$^2$ (preferably 1 to 1.5 watts/cm$^2$) and the pressure is in the range 1 to 5 Torr (preferably 1.5 to 2 Torr).

Referring to FIG. 4, after the substrate arrives at a deposition station $N_2$ and $N_2O$ are flowed at constant rates through two input ports to the reactor. The other parameters are initially set at zero. At time $t_1$ both the high-frequency radio frequency power (HFRF) and low-frequency radio frequency power (LFRF) are turned on to create a plasma. At this point no material is being deposited. At time $t_2$, $SiH_4$ is turned on and combines with the $N_2O$ to begin the deposition of a layer of undoped $SiO_2$. The interval between $t_1$ and $t_2$ is designated PreA(+). At time $t_3$, $SiF_4$ is turned on or ramped up and at this point the $SiO_2$ layer begins to be doped with F. The time between $t_2$ and $t_3$ is designated T1, and the undoped $SiO_2$ that is deposited during this interval acts as a stabilizer for the FSG sublayer. At time $t_4$, the $SiF_4$ is turned off or ramped down, terminating the F doping, and between time $t_4$ and $t_5$ undoped $SiO_2$ is deposited. The time between $t_4$ and $t_5$ is designated T2, and the undoped $SiO_2$ that is deposited during this interval acts as a stabilizer for the FSG sublayer. At time $t_5$ the $SiH_4$ is turned off and the deposition process ceases. The station deposition time (SDT) thus extends from time $t_2$ to time $t_5$. At time $t_6$ the HFRF and LFRF power is turned off terminating the plasma. The interval between $t_5$ and $t_6$ is designated PostA(+).The sublayer formed during this process has the general F doping profile shown in FIG. 3A.

In this example the $N_2O$ may be replaced with $O_2$ or $CO_2$.

Alternatively, the $SiO_2$ can be a TEOS-based film. For a TEOS-based film, the $SiH_4$ is replaced with TEOS (tetraethoxysilane) and the $N_2O$ is replaced with $O_2$ or $CO_2$. Also, other process gases may be used to provide the F dopant, including $C_2F_4$, $C_2F_6$, and $C_4F_8$.

In other embodiments the silicon glass layer is doped with boron, phosphorus or carbon. In these embodiments the F-containing gas may be replaced with $B_2H_6$ or $BCl_3$ (for boron doping), $PH_3$ (for phosphorus doping), or $CH_4$, $C_2H_2$ or alkylsilane (for carbon doping).

In the process illustrated in FIG. 5, the $SiH_4$ and $SiF_4$ are turned on essentially simultaneously at time $t_2$, and thus there is no undoped region at the bottom of the sublayer. The $SiH_4$ and $SiF_4$ are also turned off simultaneously at time $t_4$, but the $SiH_4$ is turned back on between time $t_5$ and time $t_6$, thus forming an undoped region at the top of the sublayer. The HFRF power is turned off briefly at time $t_5$ but is then immediately turned back on. The HFRF power can be turned on from the beginning through the end of the process at a given station whether the sublayer has three regions (undoped or lightly doped/heavily doped/undoped or lightly doped) or two regions (undoped or lightly doped/heavily doped or heavily doped/undoped or lightly doped).

The LFRF power can be either off or on during the interval between time $t_5$ and time $t_6$. The sublayer formed during this process has the general F doping profile shown in FIG. 3C. Increasing the LFRF power generally increases the stability of the sublayer, but it also increases the compressive stress of the sublayer. The sublayer should have a compressive stress that is reasonably close to the compressive stress of adjacent layers; a large difference in compressive stress between adjacent layers can create problems in the integration process.

The following is an example of a process actually performed in accordance with this invention.

EXAMPLE

This example describes the formation of a single sublayer of an FSG layer according to this invention on a Novellus SEQUEL EXPRESS reactor. Throughout the process $N_2$ and $N_2O$ are flowed into the reactor station at flow rates of 1,500 sccm and 10,000 sccm, respectively. The HFRF power is 1,000 watts at 13.56 MHz; the LFRF poewr is 1,300 watts at 200–400 kHz. The pressure is set at 1.8 Torr but can vary between 1.6 and 2.0 Torr. The temperature of the substrate holder is set at 400° C. Initially a check is made to determine whether the temperature is accurate; if the temperature is not accurate to within 2% (±8° C.), the reactor waits for 20 minutes to allow the temperature to reach the desired level.

With the LFRF power set at 1,300 watts, for sublayers that are undoped or lightly doped the compressive stress in the deposited film is in the range $1.0–1.3\times10^9$ dynes/cm². Alternatively, the LFRF power can be reduced to zero in which case the compressive stress is in the range $0.8–1.1\times10^9$ dynes/cm². As noted above, the compressive stress in the deposited film should be reasonably close to the compressive stress of the adjacent layers.

When the substrate arrives at the station it undergoes a "soak" period of 10 seconds to allow the substrate to reach the desired temperature. Then the HFRF and LFRF power is turned on to create plasma. After 0.5 seconds (PreA(+)), both the $SiH_4$ and $SiF_4$ are turned on. The flow rate of $SiH_4$ is 400 sccm and the flow rate of $SiF_4$ is 1,500 sccm. After 6.3 seconds the $SiF_4$ is turned off, and 2.5 seconds thereafter the $SiH_4$ is turned off. The HFRF and LFRF power are turned off 0.5 seconds later (PostA(+)). Thus the station deposition time (SDT) is 8.8 seconds. Since the $SiH_4$ and $SiF_4$ are turned on at the same time and the $SiF_4$ is turned off before the $SiH_4$, the F doping concentration has the general profile show in FIG. 3C, i.e. there is an undoped region only at the top of the FSG sublayer.

Films prepared in accordance with this invention typically have lower dielectric constants than films capped with materials such as silicon rich oxide or carbon-doped $SiO_2$. Since the dielectric constants of these materials are significantly higher than the dielectric constant of FSG, they tend to raise the overall dielectric constant of the film substantially. By comparison, the dielectric constant of undoped $SiO_2$ is only about 4.2, and this does not raise the dielectric constant of the overall film significantly.

It is believed that the undoped regions in the sublayer structure reduce and block the diffusion of F atoms between the sublayers and thus these F atoms are not available to combine with any moisture that gets into the film so as to form hydrofluoric acid (HF). As noted above, the generation of HF decreases the stability of the film and weakens its adhesion properties.

These and other advantageous characteristics of FSG films in accordance with this invention were demonstrated in several tests, the results of which are shown in FIGS. 6–8, 9A–9B, and 10A–10B.

Figure 6:
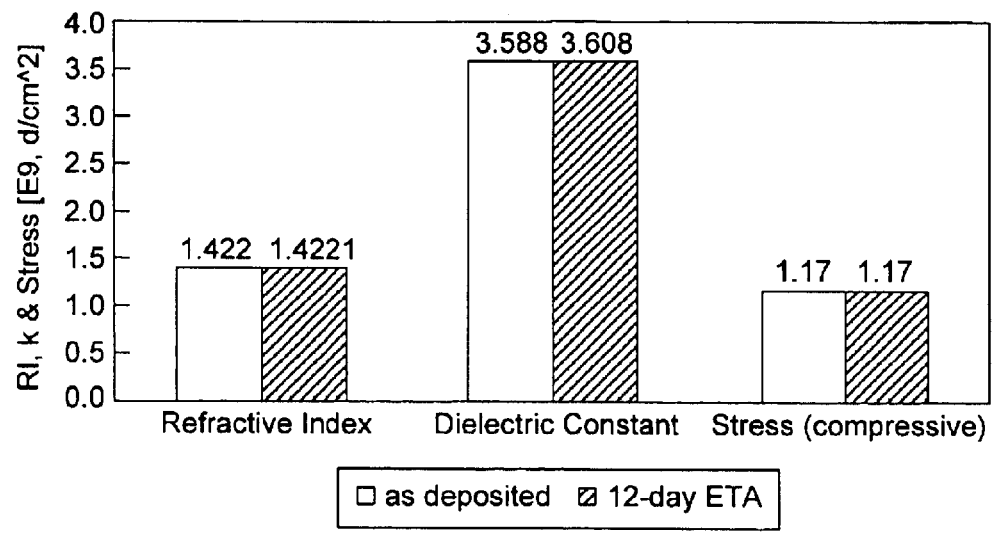
FIG. 6 is a bar graph showing the change in refractive index, dielectric constant, and compressive stress in a film prepared in accordance with this invention, as originally deposited and after being exposed to air for 12 days.

FIG. 6 is a bar graph showing the change in three properties—refractive index, dielectric constant, and compressive stress—in a film prepared in accordance with this invention, as originally deposited and after being exposed to air for 12 days. The solid bars show the original properties; the cross-hatched bars show the properties after 12 days ETA (exposure to air). The refractive index and compressive stress remained essentially constant. The dielectric constant increased only very slightly. This test demonstrates the stability of films according to this invention.

Figure 7:
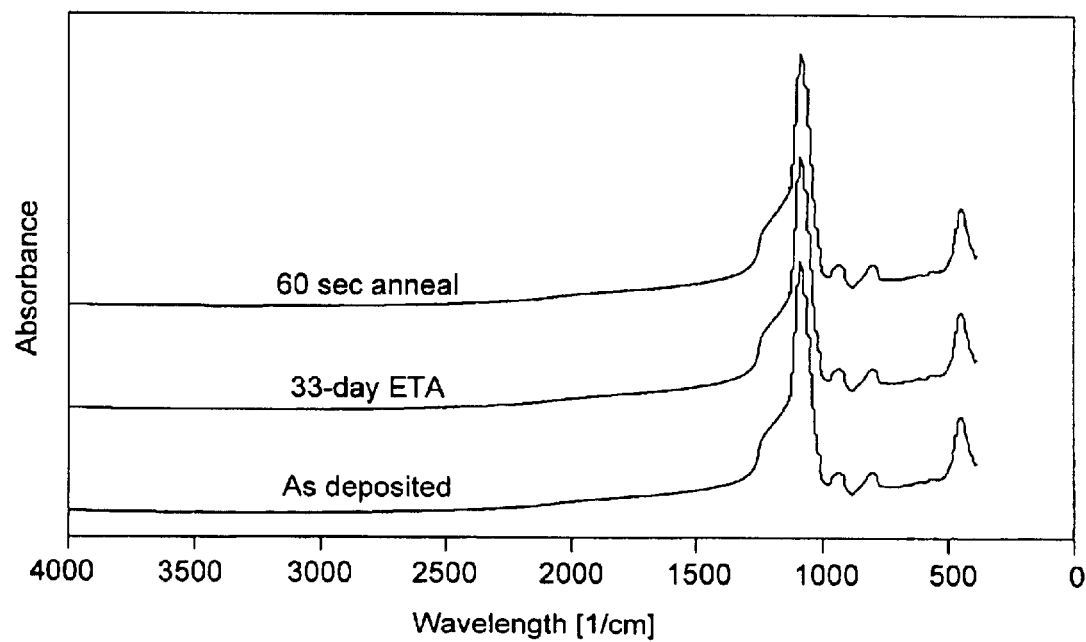
FIG. 7 is a graph showing the Fourier transform infrared (FTIR) spectrum of a film according to the invention as deposited, after 33 days ETA and after an anneal at 400° C. in $N_2$ for 60 seconds.

FIG. 7 is a graph showing the Fourier transform infrared (FTIR) spectrum of a film according to the invention as deposited, after 33 days ETA and after an anneal at 400° C. in $N_2$ for 60 seconds. The fact that the shape of spectrum does not change appreciably (in particular, the absence of the any peaks for H—O—H) demonstrates that the film is highly moisture resistant.

Figure 8:
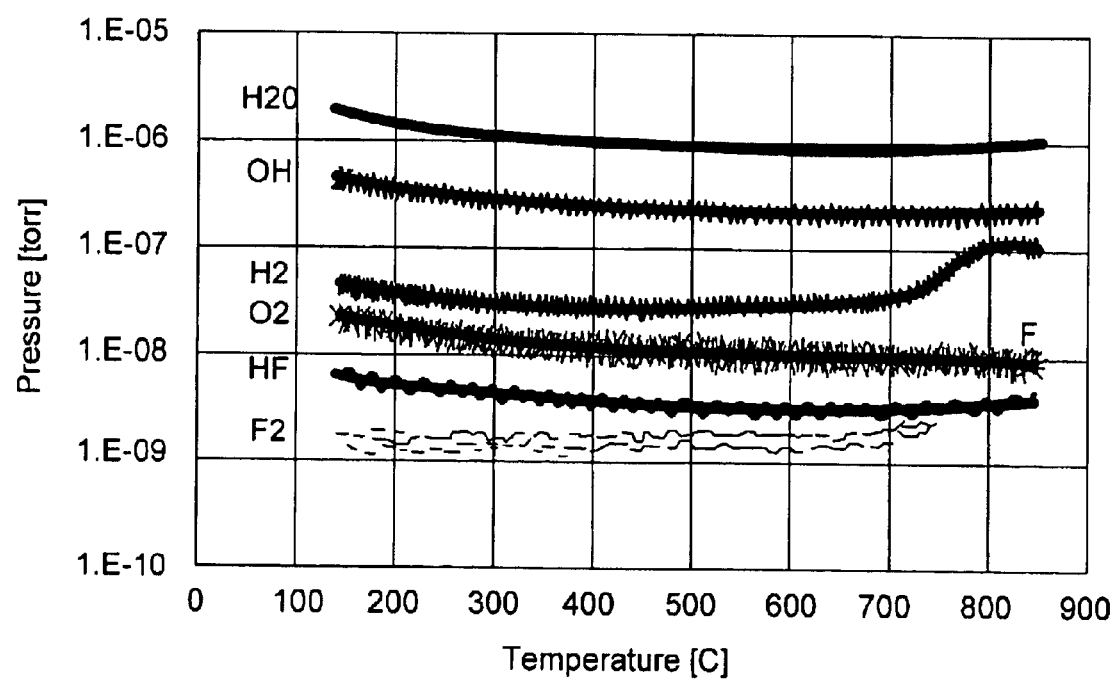
FIG. 8 is a graph showing a thermal desorption spectrum (TDS) analysis of an FSG film according to this invention.

FIG. 8 is a graph showing a thermal desorption spectrum (TDS) analysis of an FSG film according to this invention. Each of the curves shows the pressure as a function of temperature for each of the gases indicated. The fact that the pressure falls for each gas up to approximately 500° C. indicates that significant outgasing does not occur.

Figure 9A:
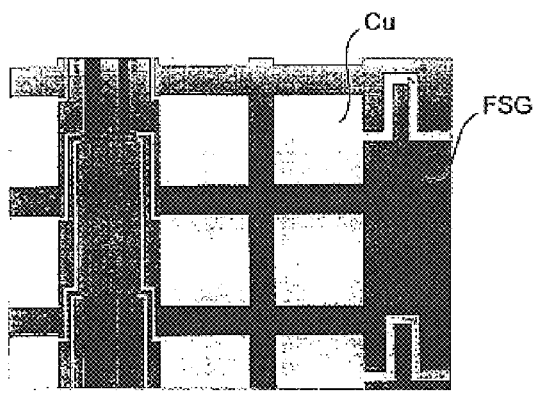
FIGS. 9A and 9B are top view microscopic images of a Cu damascene structure that included an FSG layer in accordance with this invention.
Figure 9B:
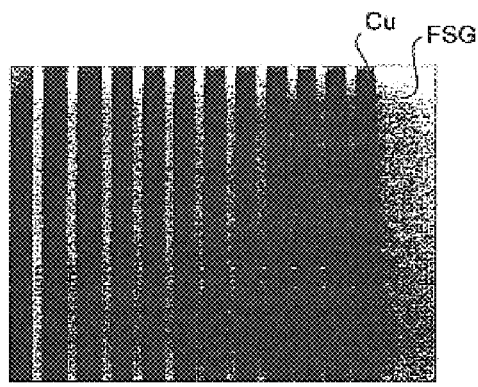

FIGS. 9A and 9B are top view microscopic images of a Cu damascene structure that included an FSG layer in accordance with this invention. After the Cu and FSG were subjected to chemical-mechanical planarization (CMP), a 700Å layer of $Si_3N_4$ was deposited over the FSG layer and the structure was annealed at 400° C. for 2.5 hours. As indicated, virtually no blistering was shown. Blistering would indicate the outgasing of HF from the FSG layer.

Figure 10A:
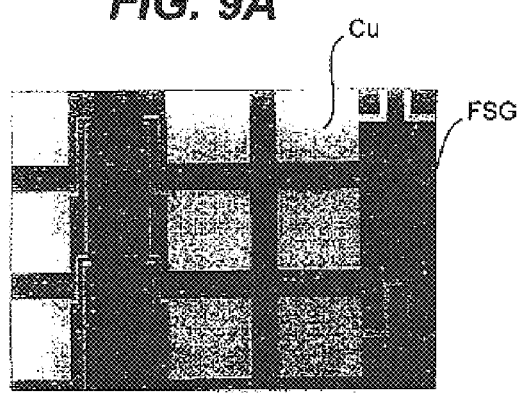
FIGS. 10A and 10B are top view microscopic images of a Cu damascene structure that included a prior art FSG layer.
Figure 10B:
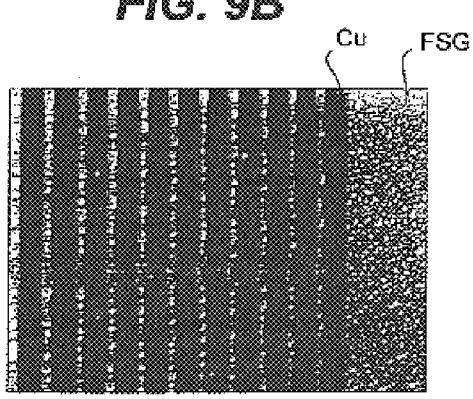

FIGS. 10A and 10B are similar images taken with a prior art FSG layer. Very significant blistering was apparent, indicating the presence of a considerable amount of HF in the FSG film.

The embodiments described above are intended to be illustrative and not limiting. Numerous other embodiments in accordance with the broad principles of this invention will be apparent to those skilled in the art. The scope of this invention is limited only by the following claims.

We claim:

1. A fluorine-doped silica glass (FSG) dielectric layer comprising a plurality of FSG sublayers, each of the sublayers abutting at least one adjacent sublayer at an interface, a first doping concentration of fluorine in an interior region of the sublayer being greater than a doping concentration of fluorine at a first interface between the sublayer and the at least one adjacent sublayer, wherein the interior region of the sublayer has a compressive film stress substantially similar to a compressive film stress at the interface between the sublayer and the at least one adjacent sublayer.

2. The fluorine-doped silica glass (FSG) dielectric layer of claim 1 wherein the first doping concentration of fluorine is greater than a second doping concentration of fluorine within a first region adjacent the first interface.

3. The fluorine-doped silica glass (FSG) dielectric layer of claim 2 wherein the second doping concentration is zero.

4. The fluorine-doped silica glass (FSG) dielectric layer of claim 2 wherein the second doping concentration increases gradually in a direction from the first interface towards the interior region.

5. The fluorine-doped silica glass (FSG) dielectric layer of claim 2 wherein the first doping concentration of fluorine is greater than a third doping concentration of fluorine within a second region adjacent a second interface between the sublayer and a second adjacent sublayer.

6. The fluorine-doped silica glass (FSG) dielectric layer of claim 5 wherein the third doping concentration is zero.

7. The fluorine-doped silica glass (FSG) dielectric layer of claim 5 wherein the third doping concentration increases gradually in a direction from the second interface towards the interior region.

8. The fluorine-doped silica glass (FSG) dielectric layer of claim 1, wherein the sublayer comprises an undoped or lightly doped region adjacent the interface, which undoped or lightly doped region has a thickness in the range of 5–30% of the thickness of the interior region.

* * * * *